US011600759B2

(12) United States Patent
Kim et al.

(10) Patent No.: US 11,600,759 B2
(45) Date of Patent: Mar. 7, 2023

(54) INTEGRATED DUAL-SIDED ALL-IN-ONE ENERGY SYSTEM INCLUDING PLURAL VERTICALLY STACKED DUAL-SIDED ALL-IN-ONE ENERGY APPARATUSES

(71) Applicant: Korea University Research and Business Foundation, Seoul (KR)

(72) Inventors: Sang Sig Kim, Seoul (KR); Kyoung Ah Cho, Seoul (KR); Yoon Beom Park, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/365,245

(22) Filed: Jul. 1, 2021

(65) Prior Publication Data
US 2022/0223777 A1 Jul. 14, 2022

(30) Foreign Application Priority Data
Jan. 8, 2021 (KR) .......................... 10-2021-0002414

(51) Int. Cl.
*H01L 35/32* (2006.01)
*H01L 35/16* (2006.01)
(Continued)

(52) U.S. Cl.
CPC .............. *H01L 35/32* (2013.01); *H01L 35/16* (2013.01); *H01L 35/18* (2013.01); *H01L 35/22* (2013.01); *H01G 11/30* (2013.01); *H01G 11/68* (2013.01)

(58) Field of Classification Search
None
See application file for complete search history.

(56) References Cited

U.S. PATENT DOCUMENTS

2003/0099279 A1* 5/2003 Venkatasubramanian ...................
B82Y 10/00
374/179
2003/0192582 A1* 10/2003 Guevara ................. H01L 35/30
136/239

(Continued)

FOREIGN PATENT DOCUMENTS

| KR | 10-2018-0049768 A | 5/2018 |
| KR | 10-2019-0093007 A | 8/2019 |
| KR | 10-2058613 B1 | 12/2019 |

OTHER PUBLICATIONS

Carmo, J. P., et al. "Integrated thin-film rechargeable battery in a thermoelectric scavenging microsystem." 2009 International Conference on Power Engineering, Energy and Electrical Drives. IEEE, Mar. 18-20, 2009, (4 pages in English).

(Continued)

*Primary Examiner* — Daniel P Malley, Jr.
(74) *Attorney, Agent, or Firm* — NSIP Law

(57) ABSTRACT

The present disclosure relates to an integrated dual-sided all-in-one energy system including a plurality of vertically stacked dual-sided all-in-one energy apparatuses, each including an energy-harvesting device and an energy-storage device disposed on both sides of a substrate, and according to one embodiment of the present disclosure, an integrated dual-sided all-in-one energy system may include a plurality of dual-sided all-in-one energy apparatuses, each including an energy-harvesting device that is formed as an electrode pattern on one side of a substrate and generates electrical energy by harvesting energy based on a temperature difference between a first side and a second side and an energy-storage device that is formed on the other side of the substrate and is selectively connected to the energy-harvesting device based on the electrode pattern to store the generated electrical energy.

8 Claims, 24 Drawing Sheets

(51) Int. Cl.
      *H01L 35/22*      (2006.01)
      *H01L 35/18*      (2006.01)
      *H01G 11/30*      (2013.01)
      *H01G 11/68*      (2013.01)

(56) References Cited

U.S. PATENT DOCUMENTS

| | | | |
|---|---|---|---|
| 2017/0213951 A1* | 7/2017 | Kim | H01L 35/10 |
| 2019/0237509 A1* | 8/2019 | Kim | H01L 27/16 |
| 2020/0152849 A1* | 5/2020 | He | H01L 35/12 |

OTHER PUBLICATIONS

Korean Office Action dated Jun. 14, 2022, in counterpart Korean Patent Application No. 10-2021-0002414 (5 pages in Korean).

\* cited by examiner

300

310

410

420

INTEGRATED DUAL-SIDED ALL-IN-ONE ENERGY SYSTEM INCLUDING PLURAL VERTICALLY STACKED DUAL-SIDED ALL-IN-ONE ENERGY APPARATUSES

CROSS-REFERENCE TO RELATED APPLICATION

This application claims priority to Korean Patent Application No. 10-2021-0002414, filed on Jan. 8, 2021 in the Korean Intellectual Property Office, the disclosure of which is incorporated herein by reference.

BACKGROUND OF THE DISCLOSURE

Field of the Disclosure

The present disclosure relates to an integrated dual-sided all-in-one energy system including a plurality of vertically stacked dual-sided all-in-one energy apparatuses, each including an energy-harvesting device and an energy-storage device disposed on both sides of a substrate. More specifically, according to the present disclosure, the energy-harvesting device and the energy-storage device are separately disposed at both sides of the substrate, and contact resistance between the energy-harvesting device and the energy-storage device is reduced by mechanical pressing, thereby improving the thermoelectric performance of the energy-harvesting device. In addition, due to a configuration characterized in that the dual-sided all-in-one energy apparatuses are vertically stacked, electrical energy may be generated and stored without loss.

Description of the Related Art

An all-in-one energy system consisting of an energy harvesting device and an energy storage device is attracting attention in the fields of wearable self-driving devices and systems.

Research on all-in-one energy systems has been conducted through various combinations of energy harvesting devices and energy storage devices.

Among these combinations, compared to piezoelectric and triboelectric generators, the combination of a thermoelectric generator (TEG) and a micro-supercapacitor (MSC) is considered promising because the thermoelectric generator generates direct current electricity that is easily stored in the micro-supercapacitor.

For example, the energy harvesting device may correspond to the thermoelectric generator, and the energy storage device may correspond to the micro-supercapacitor.

Recently, it has been confirmed that an all-in-one energy system composed of a lateral thermoelectric generator and a micro-supercapacitor can be applied to devices using body temperature and solar thermal energy.

However, since the all-in-one energy system has a structure in which the lateral thermoelectric generator and the micro-supercapacitor are disposed on the same plane, the all-in-one energy system has difficulty in storing electrical energy in the micro-supercapacitor without loss. Therefore, development in terms of structural design is required.

In the case of an integrated energy system, it is most important to preserve electrical energy generated by an energy harvesting device in an energy storage device even when energy generated by the energy harvesting device is no longer introduced.

In addition, when the potential of an energy storage device is higher than the potential of an energy harvesting device, reverse current flows from the energy storage device to the energy harvesting device. In the case of a coplanar TEGs-MSC system, reverse current may induce a Peltier effect in a thermoelectric generator, resulting in electrical energy loss of a micro-supercapacitor.

RELATED ART DOCUMENTS

Patent Documents

Korean Patent Application Publication No. 10-2018-0049768, "ENERGY HARVESTING DEVICE"

Korean Patent No. 10-2058613, "CHARGING DEVICE FOR MOBILE DEVICE USING ENERGY HARVESTING DEVICE AND METHOD THEREOF"

SUMMARY OF THE DISCLOSURE

Therefore, the present disclosure has been made in view of the above problems, and it is an object of the present disclosure to provide a dual-sided all-in-one energy apparatus including an energy-harvesting device and an energy-storage device disposed at both sides of a substrate.

It is another object of the present disclosure to provide an integrated dual-sided all-in-one energy system including a plurality of vertically stacked dual-sided all-in-one energy apparatuses. With this configuration, a temperature difference between the high-temperature electrode and the low-temperature electrode of an energy-harvesting device may be increased, and as a result, the thermoelectric efficiency of the integrated dual-sided all-in-one energy system may be improved, and the electrical energy generation efficiency and capacity thereof may be increased.

It is still another object of the present disclosure to provide a dual-sided all-in-one energy apparatus including an energy-harvesting device and an energy-storage device that are separated with respect to a substrate. With this configuration, the dual-sided all-in-one energy apparatus may prevent reverse current from flowing from the energy-storage device to the energy-harvesting device.

It is still another object of the present disclosure to reduce the contact resistance between an energy-harvesting device and an energy-storage device by mechanical pressing and improve the thermoelectric performance of the energy-harvesting device by placing the energy-harvesting device and the energy-storage device separately on each side.

It is still another object of the present disclosure to improve energy harvesting and storage performance by generating and storing electrical energy without loss by vertically laminating a plurality of dual-sided all-in-one energy apparatuses.

It is still another object of the present disclosure to provide an integrated dual-sided all-in-one energy system capable of preserving electrical energy stored in an energy-storage device by separating an energy-harvesting device and the energy-storage device in a dual-sided all-in-one energy apparatus.

It is still another object of the present disclosure to provide an integrated dual-sided all-in-one energy system that is attached to a part of the human body to harvest energy from the body's thermal energy to generate electrical energy, and stores the generated electrical energy in an energy-storage device. According to the present disclosure, the integrated dual-sided all-in-one energy system may store the electrical energy without losing energy until the energy-storage device is forcibly discharged.

It is still another object of the present disclosure to apply an integrated dual-sided all-in-one energy system including a plurality of vertically stacked dual-sided all-in-one energy apparatuses to a wearable apparatus. According to the present disclosure, the wearable apparatus including the integrated dual-sided all-in-one energy system may power itself.

It is yet another object of the present disclosure to provide a dual-sided all-in-one energy apparatus that is formed in a flexible form and may be applied to various wearable apparatuses. According to the present disclosure, wearable apparatuses including the dual-sided all-in-one energy apparatus may power themselves.

In accordance with one aspect of the present disclosure, provided is an integrated dual-sided all-in-one energy system including a plurality of dual-sided all-in-one energy apparatuses, each including an energy-harvesting device that is formed as an electrode pattern on one side of a substrate and generates electrical energy by harvesting energy based on a temperature difference between a first side and a second side and an energy-storage device that is formed on the other side of the substrate and is selectively connected to the energy-harvesting device based on the electrode pattern to store the generated electrical energy, wherein the dual-sided all-in-one energy apparatuses are vertically stacked and are interconnected in series.

The dual-sided all-in-one energy apparatuses may be stacked so that the first side and the second side are perpendicular to each other, and the electrode pattern may be formed so that metal electrodes are interconnected in series at one of the first and second sides.

The energy-harvesting device may be formed of an n-type thermoelectric material, a p-type thermoelectric material, and metal electrodes.

The n-type thermoelectric material and the p-type thermoelectric material may be formed into a plurality of modules including a thermoelectric channel, each of the modules may include an n-type thermoelectric film and a p-type thermoelectric film, and the metal electrodes may be formed at both ends of the thermoelectric channel.

The energy-harvesting device may be controlled so that, as the n-type thermoelectric film and the p-type thermoelectric film are brought into close contact with the metal electrodes by mechanical pressing, resistance between the modules and the metal electrodes decreases, and conductivity increases.

The n-type thermoelectric material may include at least one of $Bi_2Se_{0.3}Te_{2.7}$, $Ag_2Se$, HgSe, $Ti_2C_3$, $Mo_2Ti_2C_3$, PbTe, $COSb_3$, SiGe, and ZnO, the p-type thermoelectric material may include at least one of $Bi_{0.3}Sb_{1.7}Te_3$, $Ag_2Te$, HgTe, $Mo_2C$, $CeFe_4Sb_{12}$, $Sb_2Te_3$, and $Cu_2O$, and the metal electrodes may be formed of at least one of aluminum (Al), gold (Au), titanium (Ti), copper (Cu), and tungsten (W).

The energy-storage device may consist of a capacitor electrode formed of at least one of reduced graphene oxide (rGO), carbon nanotubes (CNTs), graphene, $TiO_2$, ZnO, $MnO_2$, and $Ti_3C_2$ and a current collector formed of at least one of aluminum (Al), gold (Au), titanium (Ti), and copper (Cu).

The capacitor electrode and the current collector may be connected to each other to form a microelectrode, and the current collector may be formed to extend to both ends of the substrate.

The electrode pattern may electrically connect or disconnect the energy-harvesting device and the energy-storage device as the current collector of the energy-storage device extends to both ends of the substrate.

When the energy-storage device discharges, the electrode pattern may disconnect the energy-harvesting device and the energy-storage device, thereby preventing reverse current from flowing backward from the energy-storage device to the energy-harvesting device.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
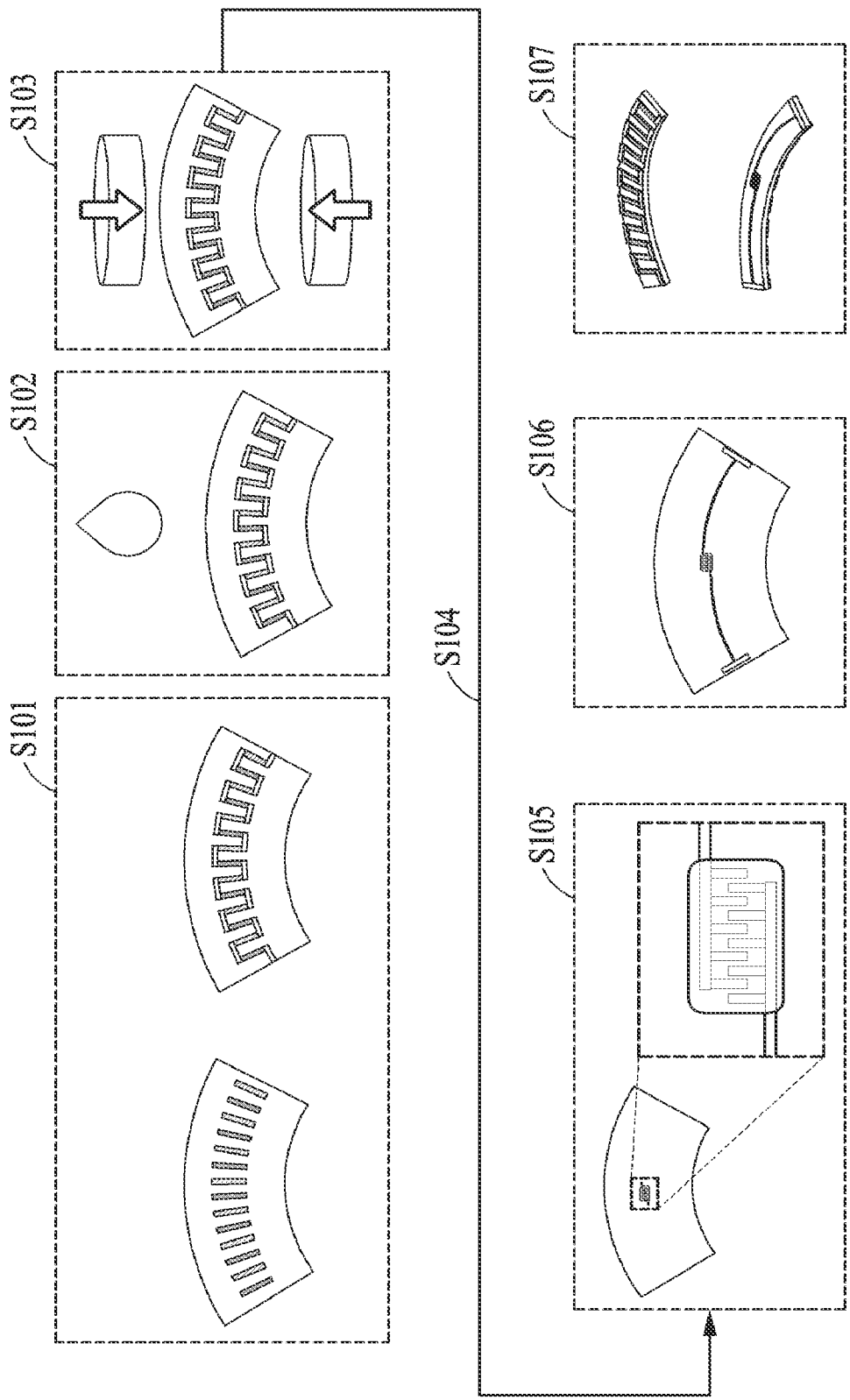
FIG. 1 includes drawings for explaining a method of manufacturing a dual-sided all-in-one energy apparatus according to one embodiment of the present disclosure.

Hereinafter, the embodiments of the present disclosure will be described in detail with reference to the drawings.

However, it should be understood that the present disclosure is not limited to the embodiments according to the concept of the present disclosure, but includes changes, equivalents, or alternatives falling within the spirit and scope of the present disclosure.

In the following description of the present disclosure, detailed description of known functions and configurations incorporated herein will be omitted when it may make the subject matter of the present disclosure unclear.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless mentioned otherwise or clearly inferred from context, the expression "x uses a or b" means any one of natural inclusive permutations.

Terms, such as "unit" or "module", etc., should be understood as a unit that processes at least one function or operation and that may be embodied in a hardware manner, a software manner, or a combination of the hardware manner and the software manner.

FIG. 1 includes drawings for explaining a method of manufacturing a dual-sided all-in-one energy apparatus according to one embodiment of the present disclosure.

According to the method of manufacturing a dual-sided all-in-one energy apparatus according to one embodiment of the present disclosure shown in FIG. 1, an energy-harvesting device and an energy-storage device are formed on opposite sides of a substrate, and the energy-harvesting device and the energy-storage device are electrically connected or disconnect through an electrode pattern included in the energy-harvesting device.

Referring to FIG. 1, according to the method of manufacturing a dual-sided all-in-one energy apparatus according to one embodiment of the present disclosure, in step S101, the energy-harvesting device is formed on one side of the substrate through screen printing, annealing, and thermal deposition processes.

More specifically, according to the method of manufacturing a dual-sided all-in-one energy apparatus, in step S101, a screen printing process is performed using at least one of $Bi_2Se_{0.3}Te_{2.7}$, $Ag_2Se$, $HgSe$, $Ti_2C_3$, $Mo_2Ti_2C_3$, $PbTe$, $COSb_3$, $SiGe$, and $ZnO$, which are n-type thermoelectric materials, and at least one of $Bi_{0.3}Sb_{1.7}Te_3$, $Ag_2Te$, $HgTe$, $Mo_2C$, $CeFe_4Sb_{12}$, $Sb_2Te_3$, and $Cu_2O$, which are p-type thermoelectric materials. Thereafter, an annealing process is performed, and then a thermal deposition process is performed to form metal electrodes at both ends of a thermoelectric channel, thereby forming the energy-harvesting device.

For example, the energy-harvesting device may be referred to as an energy generator or an energy generating device, and the present disclosure is not limited to the exemplary energy-harvesting device.

For example, the metal electrodes formed at both ends of the thermoelectric channel may be divided into a high-temperature electrode and a low-temperature electrode.

The high-temperature electrode may be an electrode in contact with a heat source, and the low-temperature electrode may be an electrode in contact with air or a material having a relatively low temperature compared to the heat source.

Hereinafter, some of p-type thermoelectric materials, n-type thermoelectric materials, and metal electrode materials will be limitedly described in the following description, but the present disclosure is not limited thereto, and all of the materials may be used.

Here, in the screen printing process, a pallet made of a thermoelectric material is ball-milled for 20 hours. Butyl carbitol acetate as a solvent and ethyl cellulose as a binder are mixed to prepare a screen printing paste. Then, the thermoelectric material paste is screen-printed, and is dried on a hot plate at about 80° C. for 10 min. At this time, these processes are repeated three times.

In addition, in the annealing process, annealing may be performed at 280° C. for about 1 hour in a furnace under a nitrogen dioxide atmosphere.

After the screen printing process and the annealing process, a thermoelectric channel is formed. In this case, the thermoelectric channel may have dimensions of about 1 cm in length and about 1 mm in width.

Here, in the energy-harvesting device, seven pairs of pn modules and one p-type thermoelectric channel may be formed. In this case, the p-type thermoelectric channel may be used to align a plurality of electrodes included in the energy-harvesting device.

The metal electrodes formed through the thermal deposition process may be formed using aluminum (Al), and may be disposed at both ends of the p-type thermoelectric channel. Here, both ends of the thermoelectric channel may be divided into a first side and a second side. In this case, the first side may correspond to a hot side corresponding to a heat source side, and the second side may correspond to a cold side corresponding to an air side.

According to the method of manufacturing a dual-sided all-in-one energy apparatus according to one embodiment of the present disclosure, in step S102, to protect the energy-harvesting device from external impact, a colorless polyimide (CPI) film is formed on the energy-harvesting device.

Specifically, the colorless polyimide film may be formed by spin-coating the energy-harvesting device with a CPI solution, performing baking in an oven at 100° C. for 10 minutes, and then performing baking at 250° C. for 30 minutes.

According to the method of manufacturing a dual-sided all-in-one energy apparatus according to one embodiment of the present disclosure, in step S103, a process of forming the energy-harvesting device is completed by applying mechanical pressing (MP) to the energy-harvesting device.

For example, the energy-harvesting device may be formed of an n-type thermoelectric material, a p-type thermoelectric material, and metal electrodes. The n-type thermoelectric material and the p-type thermoelectric material may be formed into a plurality of modules including a thermoelectric channel. Each of the modules may include an n-type thermoelectric film and a p-type thermoelectric film, and the metal electrodes may be formed at both ends of the thermoelectric channel.

For example, the pressure of mechanical pressing may be about 40 MPa.

The energy-harvesting device may be controlled so that, as the n-type thermoelectric film and the p-type thermoelectric film are brought into close contact with the metal electrodes by mechanical pressing, resistance between the modules and the metal electrodes decreases, and conductivity increases.

In addition, since the energy-harvesting device is densely formed by compression between the modules and the metal electrodes, the electrical conductivity thereof may be increased.

According to the method of manufacturing a dual-sided all-in-one energy apparatus according to one embodiment of the present disclosure, in step S104, the substrate may be rotated oppositely to form the energy-storage device on the side opposite to a side on which the energy-harvesting device is formed.

According to the method of manufacturing a dual-sided all-in-one energy apparatus according to one embodiment of the present disclosure, in step S105, the energy-storage device is formed on the other side of the substrate through lithography, spin coating, and thermal deposition processes.

Specifically, according to the method of manufacturing a dual-sided all-in-one energy apparatus, the energy-storage device is formed in the form of an electrode pattern having a predetermined pattern using a capacitor electrode formed of at least one of reduced graphene oxide (rGO), carbon nanotubes (CNTs), graphene, $TiO_2$, ZnO, $MnO_2$, and $Ti_3C_2$ and a current collector formed of at least one of aluminum (Al), gold (Au), titanium (Ti), and copper (Cu).

Hereinafter, some of the materials of the capacitor electrode and some of the materials of the current collector will be limitedly described in the following description, but the present disclosure is not limited thereto, and all of the materials may be used.

For example, the energy-storage device may be referred to as a storage device, a storage, or an energy storage device, and the present disclosure is not limited the exemplary energy-storage device.

For example, in the method of manufacturing a dual-sided all-in-one energy apparatus, an rGO/CNT electrode as the capacitor electrode may be prepared by mixing 3 mg of $TiO_2$ power dissolved in 1 ml of ethanol with 7.5 ml of a graphene oxide (GO) dispersion solution and then dispersing 9 mg of CNT power. According to the preparation method, electrical conductivity may be increased.

In addition, in the method of manufacturing a dual-sided all-in-one energy apparatus, the mixture is irradiated with UV light for 6 hours to convert GO to rGO.

In addition, in the method of manufacturing a dual-sided all-in-one energy apparatus, the current collector is coated with the rGO/CNT dispersion solution, and then $H_3PO_4$-PVA electrolytic coating is performed on the rGO/CNT film.

Then, in the method of manufacturing a dual-sided all-in-one energy apparatus, heat treatment is performed at 80° C. to dry the electrolyte membrane and suppress the Soret effect that adversely affects the performance of the energy-storage device.

In addition, the rGO electrode and the CNT electrode may be formed as microelectrodes with a structure that is interlocked and interconnected.

According to the method of manufacturing a dual-sided all-in-one energy apparatus according to one embodiment of the present disclosure, in step S106, the electrode is extended.

That is, in the method of manufacturing a dual-sided all-in-one energy apparatus, the thermally deposited current collector of the energy-storage device is extended to both ends of the substrate to enable connection or disconnection between the energy-harvesting device and the energy-storage device.

According to the method of manufacturing a dual-sided all-in-one energy apparatus according to one embodiment of the present disclosure, in step S107, the substrate is cut in an arc shape so that the electrode of the energy-storage device is in direct contact with a heat source such as a round-shaped heater and a human arm. For example, the substrate may be a flexible substrate.

The dual-sided all-in-one energy apparatus manufactured by the above-described method of manufacturing a dual-sided all-in-one energy apparatus according to one embodiment of the present disclosure includes the energy-harvesting device and the energy-storage device.

The energy-harvesting device may be formed as an electrode pattern on one side of the substrate, and may harvest energy based on a temperature difference between a first side and a second side to generate electrical energy.

In addition, the energy-storage device may be formed on the other side of the substrate, and may selectively connect to the energy-harvesting device based on the electrode pattern to store the generated electrical energy.

For example, as the current collector of the energy-storage device extends to both ends of the substrate, the electrode pattern may electrically connect or disconnect the energy-harvesting device and the energy-storage device.

Specifically, the electrode pattern includes a pattern in which the thermoelectric channel is formed in the vertical direction of the substrate and the metal electrodes are formed at both ends of the thermoelectric channel in the horizontal direction of the substrate.

In addition, in the energy-storage device, the current collector is formed to extend to both ends of the substrate. At this time, the front parts of both ends thereof are extended.

That is, when the metal electrodes are divided in the vertical direction of the substrate, the electrode pattern and the current collector formed only in one portion are formed to extend to the vertical direction of the substrate, so that the metal electrodes and the current collector are selectively connected.

Accordingly, when the metal electrodes formed at both ends of the thermoelectric channel of the electrode pattern and the current collector are connected, the energy-harvesting device and the energy-storage device are connected. When the current collector is connected to a place where the thermoelectric channel is not formed on the electrode pattern, the energy-harvesting device and the energy-storage device are disconnected.

Accordingly, the present disclosure may provide a dual-sided all-in-one energy apparatus including an energy-harvesting device and an energy-storage device disposed at both sides of a substrate.

In addition, the present disclosure may provide the dual-sided all-in-one energy apparatus that blocks reverse current that may be transferred from the energy-storage device to the energy-harvesting device when the energy-harvesting device and the energy-storage device are separated with respect to the substrate.

In addition, according to the present disclosure, the energy-harvesting device and the energy-storage device are disposed at both sides, the contact resistance between the energy-harvesting device and the energy-storage device is reduced by mechanical pressing, thereby improving the thermoelectric performance of the energy-harvesting device.

According to one embodiment of the present disclosure, a plurality of dual-sided all-in-one energy apparatuses manufactured by the method of manufacturing a dual-sided all-in-one energy apparatus may be vertically stacked and may be interconnected in series to form an integrated dual-sided all-in-one energy system.

For example, the dual-sided all-in-one energy apparatuses may be stacked so that the first side and the second side are perpendicular to each other, and the electrode pattern may be formed so that metal electrodes are interconnected in series at any one of the first side and the second side.

For example, the first side may correspond to a hot side corresponding to a heat source side, and the second side may correspond to a cold side corresponding to an air side.

Figure 2A:
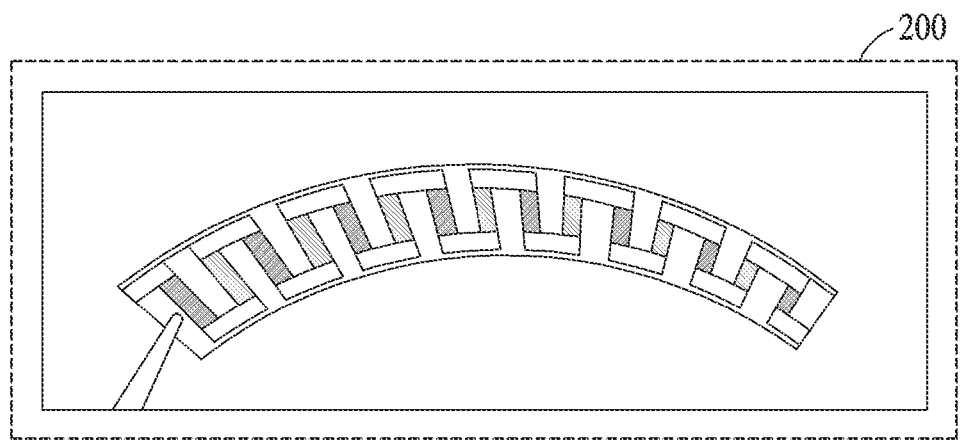
FIG. 2A includes images showing a dual-sided all-in-one energy apparatus according to one embodiment of the present disclosure.
Figure 2A:
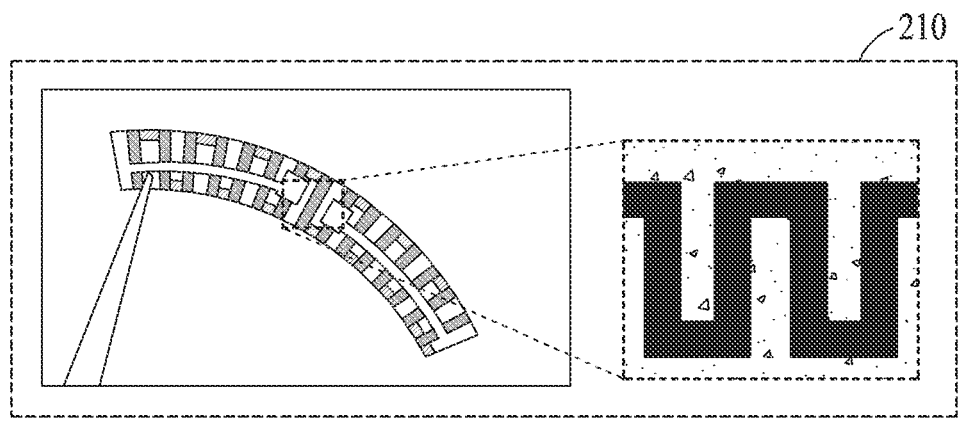

FIG. 2A includes images showing a dual-sided all-in-one energy apparatus according to one embodiment of the present disclosure.

FIG. 2A shows exemplary images of the dual-sided all-in-one energy apparatus according to one embodiment of the present disclosure.

Referring to FIG. 2A, an image 200 shows the energy-harvesting device side of the dual-sided all-in-one energy apparatus, and an image 210 shows the energy-storage device side of the dual-sided all-in-one energy apparatus.

For example, the energy-harvesting device may be referred to as a thermoelectric generator (TEG), and the energy-storage device may be referred to as a micro-supercapacitor (MSC).

Referring to the image 200 and the image 210, due to the transparency of the substrate, the energy-harvesting device and the energy-storage device may be seen from each side, and it can be confirmed that the electrode pattern is formed in the energy-harvesting device.

In the image 210, the square wave pattern may represent the pattern of the energy-harvesting device projected on the transparent substrate.

In addition, in the image 210, a structure in which the current collector is extended to both ends of the substrate is clearly observed.

Figure 2B:
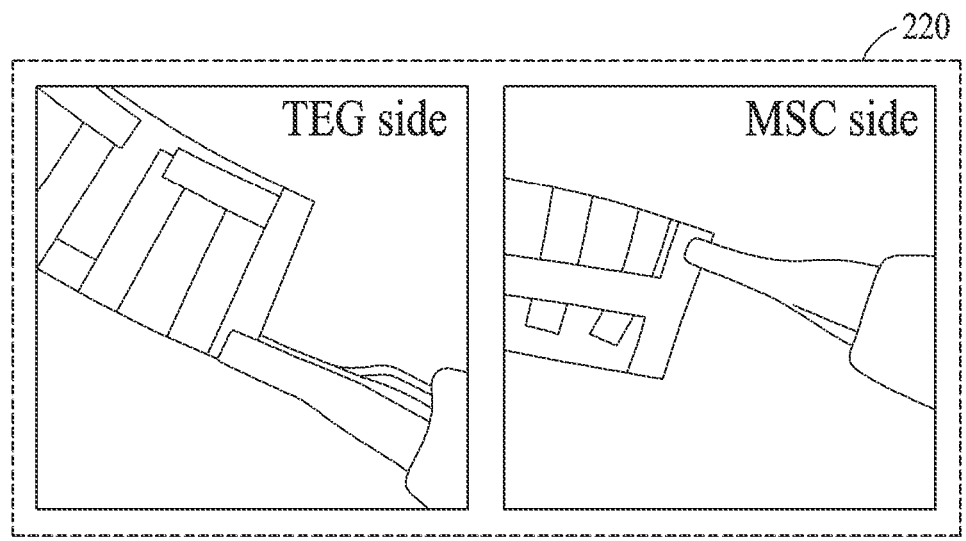
FIG. 2B includes images showing a process of connecting and disconnecting an energy-harvesting device and an energy-storage device in a dual-sided all-in-one energy apparatus according to one embodiment of the present disclosure.
Figure 2B:
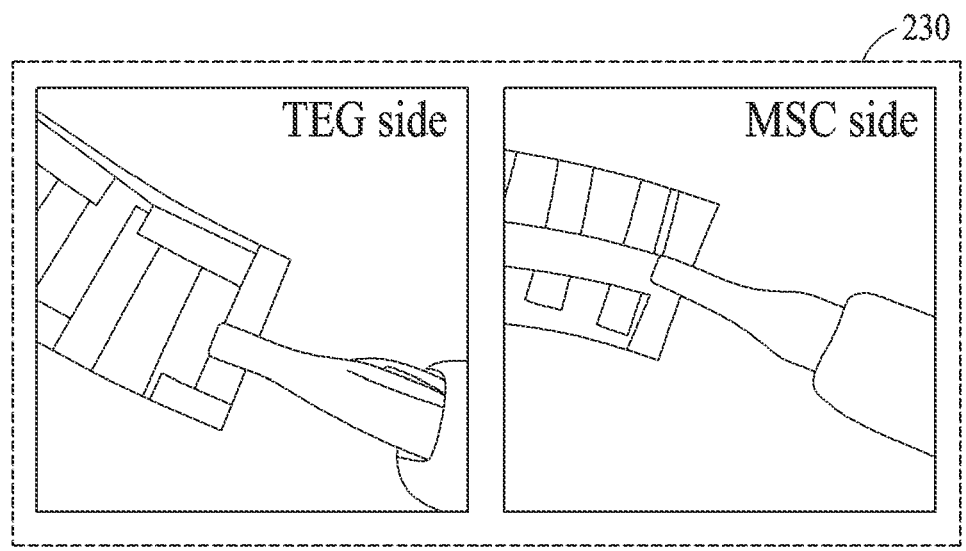

FIG. 2B includes images showing a process of connecting and disconnecting an energy-harvesting device and an energy-storage device in a dual-sided all-in-one energy apparatus according to one embodiment of the present disclosure.

FIG. 2B shows exemplary images showing the states when the energy-harvesting device and the energy-storage device in the dual-sided all-in-one energy apparatus according to one embodiment of the present disclosure are connected or disconnected.

Referring to FIG. 2B, an image 220 shows a state in which the energy-harvesting device and the energy-storage device in the dual-sided all-in-one energy apparatus are connected, and an image 230 shows a state in which the energy-harvesting device and the energy-storage device in the dual-sided all-in-one energy apparatus are disconnected.

When generating thermoelectric voltage that is charged to the energy-harvesting device and the energy-storage device, a flat alligator clip may be coupled to the electrode (located on top or bottom of the substrate) of the energy-harvesting device and the extended current collector of the energy-storage device.

After charging from the energy-harvesting device to the energy-storage device, the energy-harvesting device and the energy-storage device may be separated by separating the flat alligator clip coupled only to the extended current collector of the energy-storage device. For example, the current collector may be located at the center of the substrate of the energy-storage device.

That is, the channel end of the energy-harvesting device may be located at only one portion at both ends of the substrate, and the current collector of the energy-storage device may be located at all portions at both ends of the substrate.

Accordingly, when the flat alligator clip is located at the center of both ends of the substrate on which the dual-sided all-in-one energy apparatus is formed, the energy-harvesting device and the energy-storage device are disconnected. When the flat alligator clip is located at the edges of both ends of the substrate, the energy-harvesting device and the energy-storage device are connected.

In addition, metal electrodes formed in the thermoelectric channel on the electrode pattern of the energy-harvesting device may be positioned at the edges of both ends of the substrate.

FIGS. 3A to 3D are graphs showing change in the electrical properties of a dual-sided all-in-one energy apparatus according to one embodiment of the present disclosure according to mechanical pressing.

FIGS. 3A to 3D show the current and voltage characteristics of the energy-harvesting device according to one embodiment of the present disclosure and a Seebeck voltage effect according to mechanical pressing.

Referring to FIGS. 3A to 3D, in the process of forming the energy-harvesting device, after mechanical pressing is performed, a Seebeck voltage and current flowing through both the n-type thermoelectric film and the p-type thermoelectric film are increased to improve thermoelectric properties of the energy-harvesting device.

Figure 3A:
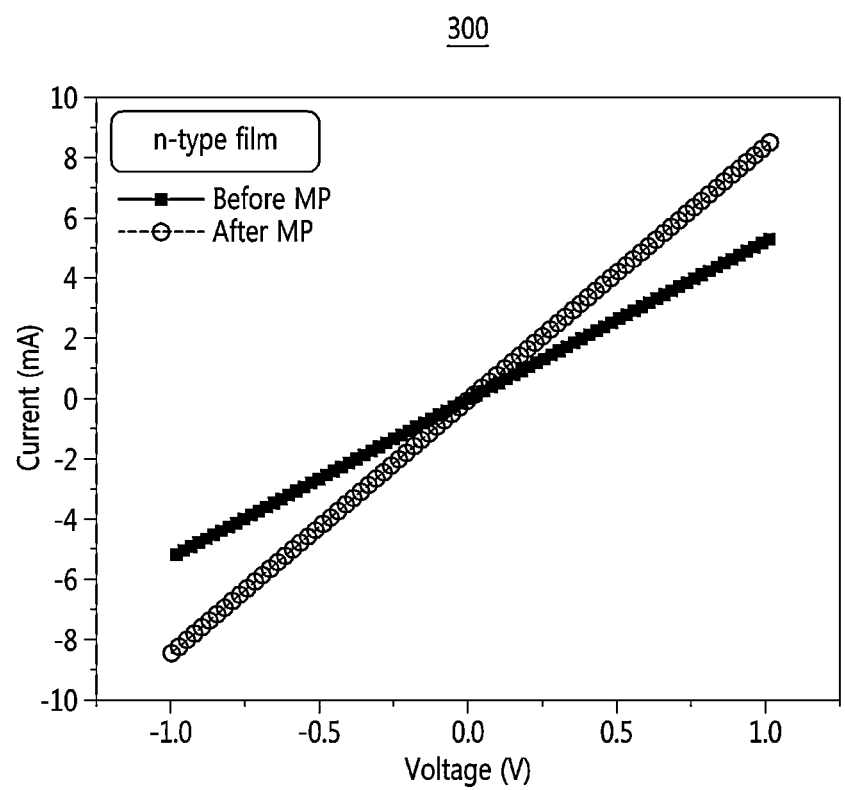
FIGS. 3A to 3D are graphs showing change in the electrical properties of a dual-sided all-in-one energy apparatus according to one embodiment of the present disclosure according to mechanical pressing.
Figure 3B:
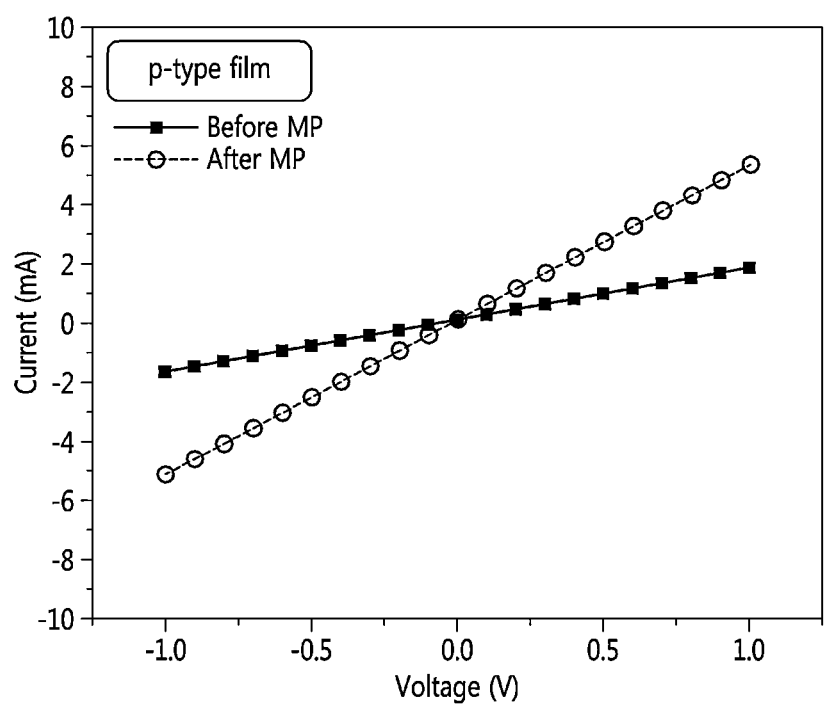

Specifically, a graph 300 of FIG. 3A shows the current and voltage characteristics of the n-type thermoelectric film, and a graph 310 of FIG. 3B shows the current and voltage characteristics of the p-type thermoelectric film.

Figure 3C:
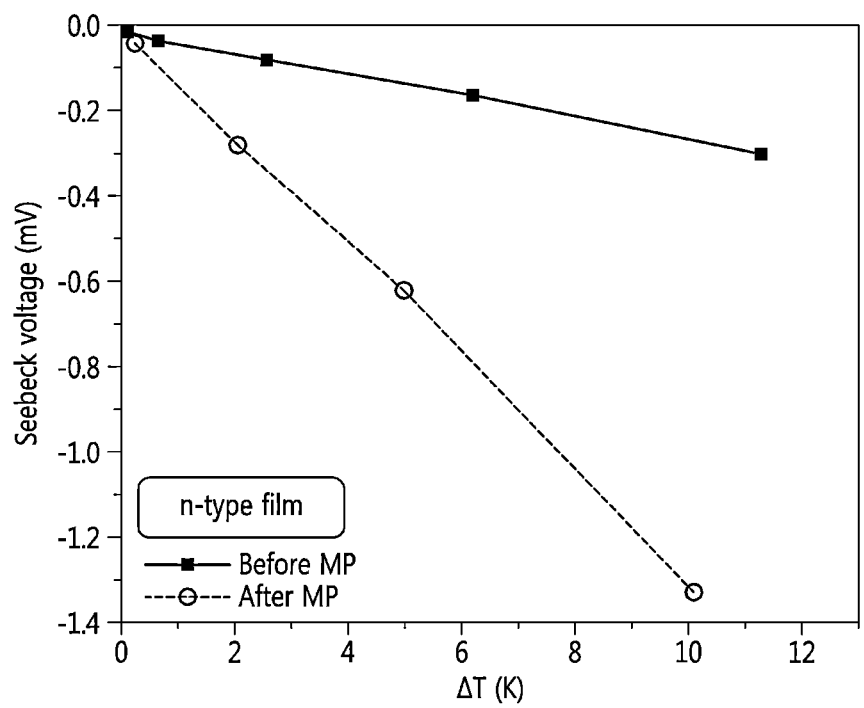
Figure 3D:
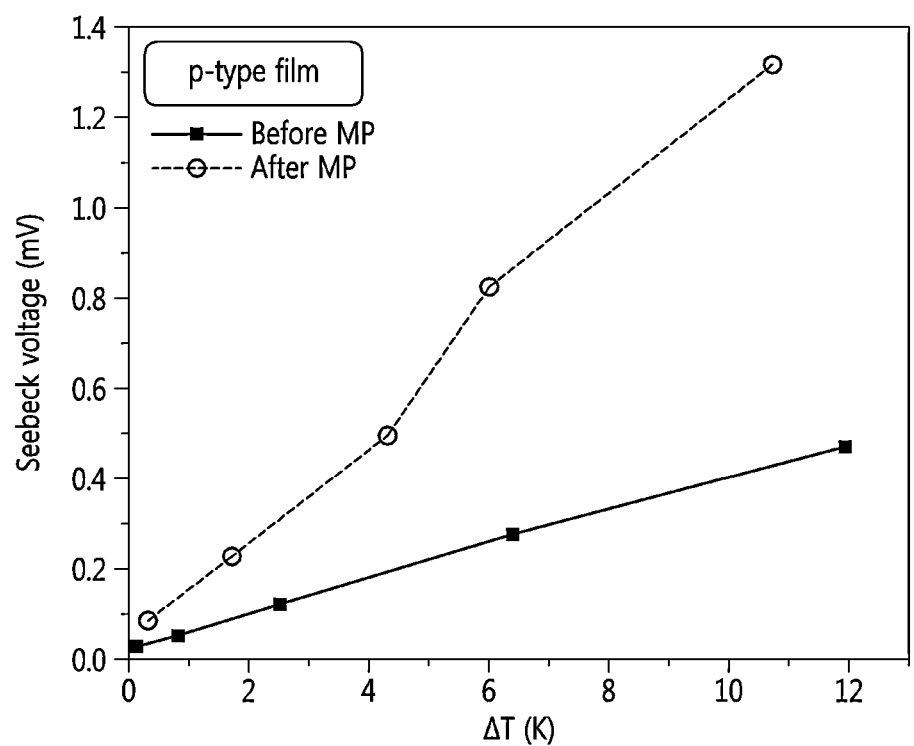

In addition, a graph 320 of FIG. 3C shows the Seebeck voltage of the n-type thermoelectric film, and a graph 330 of FIG. 3D shows the Seebeck voltage of the p-type thermoelectric film.

For example, Seebeck voltage may be generated by a temperature difference between the high-temperature electrode and the low-temperature electrode of the energy-harvesting device.

For example, the high-temperature electrode may be an electrode in contact with a heat source, and the low-temperature electrode may be an electrode exposed to room temperature.

Referring to the graph 300 of FIG. 3A and the graph 310 of FIG. 3B, in the energy-harvesting device according to one embodiment of the present disclosure, when comparing before mechanical pressing (Before MP) and after mechanical pressing (After MP), the current and voltage characteristics of the n-type and p-type thermoelectric films are improved.

In addition, referring to the graph 320 of FIG. 3C and the graph 330 of FIG. 3D, in the energy-harvesting device according to one embodiment of the present disclosure, when comparing before mechanical pressing (Before MP) and after mechanical pressing (After MP), the Seebeck voltage of the n-type and p-type thermoelectric films according to temperature difference ($\Delta T$) is increased.

Accordingly, according to the present disclosure, the energy-harvesting device and the energy-storage device are disposed at both sides, the contact resistance between the energy-harvesting device and the energy-storage device is reduced by mechanical pressing, thereby improving the thermoelectric performance of the energy-harvesting device.

FIGS. 4A to 4D are optical images showing the morphological change of a dual-sided all-in-one energy apparatus according to one embodiment of the present disclosure according to mechanical pressing.

Specifically, FIGS. 4A to 4D show optical images taken with an optical profiler before and after mechanical pressing and electron microscopy images of an energy-harvesting device using n-type and p-type thermoelectric films.

Figure 4A:
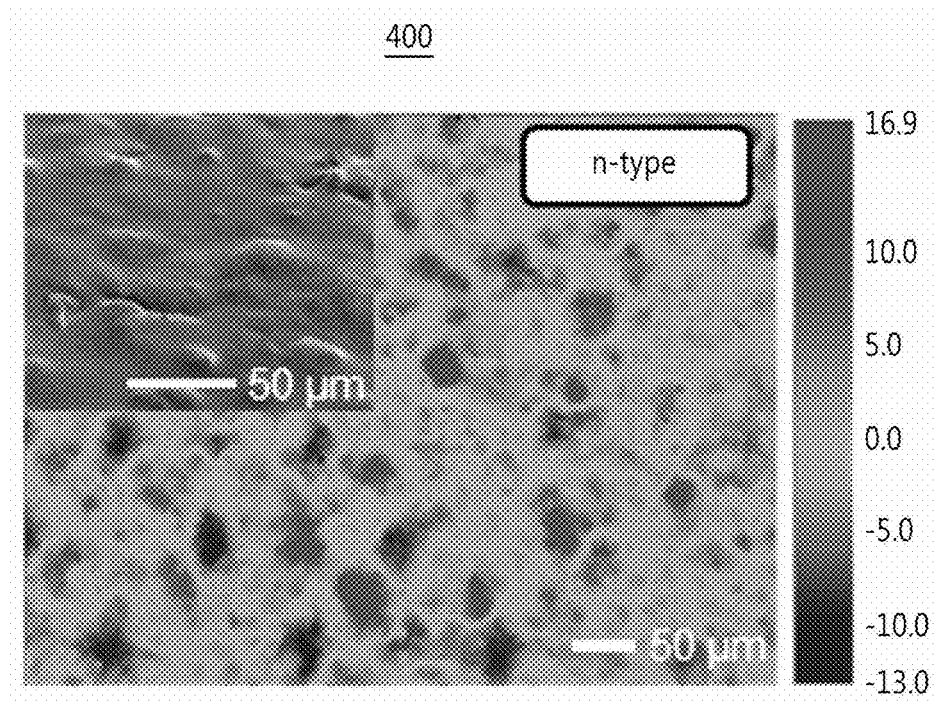
FIGS. 4A to 4D are optical images showing the morphological change of a dual-sided all-in-one energy apparatus according to one embodiment of the present disclosure according to mechanical pressing.
Figure 4B:
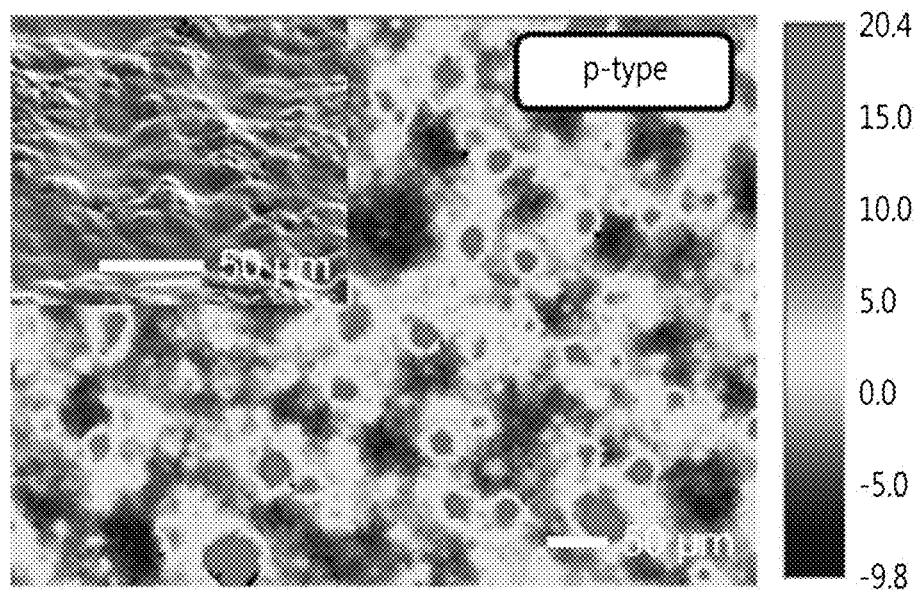

Referring to an image 400 of FIG. 4A and an image 410 of FIG. 4B, the surface roughness values of the n-type and p-type thermoelectric films before mechanical pressing may be 2.6 and 2.9 μm, respectively.

Figure 4C:
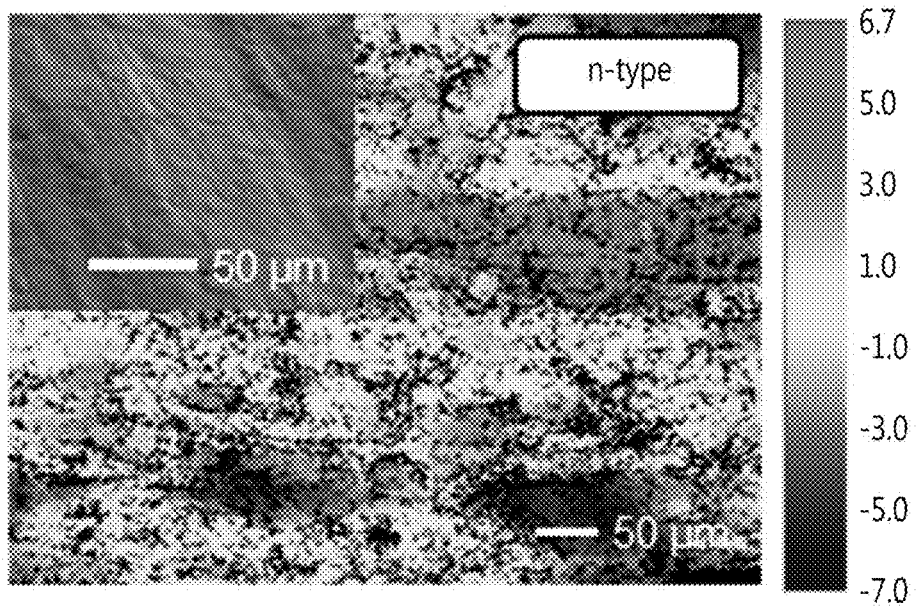
Figure 4D:
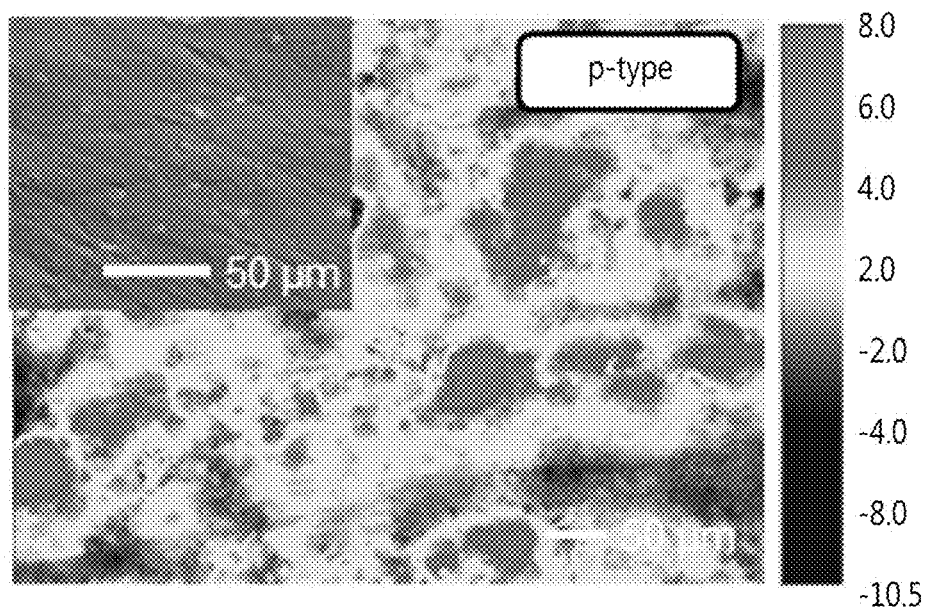

Referring to an image 420 of FIG. 4C and an image 430 of FIG. 4D, the surface roughness values of the n-type and p-type thermoelectric films after mechanical pressing may be 1.6 and 1.7 μm, respectively.

That is, as shown in the electron microscope images, mechanical pressing may promote formation of a smooth surface.

In addition, Table 1 below summarizes the effect of mechanical pressing for the properties of a thermoelectric film where ZT is the figure of merit ($S^2\sigma T/\kappa$, S: Seebeck coefficient, σ: electrical conductivity, T: absolute temperature, K: thermal conductivity).

In addition to the intrinsic properties of the thermoelectric material, the performance of the energy-harvesting device may vary depending on contact between the thermoelectric material and the electrode.

TABLE 1

|  | N-type thermoelectric film | | P-type thermoelectric film | |
| --- | --- | --- | --- | --- |
|  | Before MP | After MP | Before MP | After MP |
| Seebeck coefficient (μV/K) | −25 | −130 | 37 | 122 |
| Electrical conductivity (S/m) | 1,766 | 2,839 | 593 | 1,754 |
| Thermal conductivity (W/m · K) | 0.48 | 0.75 | 0.52 | 0.68 |
| ZT | $6.9 \times 10^{-4}$ | $2.0 \times 10^{-2}$ | $4.7 \times 10^{-4}$ | $1.2 \times 10^{-2}$ |
| Roughness (μm) | 2.6 | 1.6 | 2.9 | 1.7 |
| Thickness (μm) | 37 | 34 | 45 | 41 |
| Density (g/cm$^3$) | 11.1 | 12.1 | 8.2 | 9.0 |

In Table 1, thermoelectric conductivity, thickness, and density are the properties of thermoelectric films, and electrical conductivity and roughness include the relationship between the thermoelectric films and the electrode.

FIGS. 5A to 5D are graphs showing change in the electrical properties of a dual-sided all-in-one energy apparatus according to one embodiment of the present disclosure according to temperature difference and connection/disconnection.

Figure 5A:
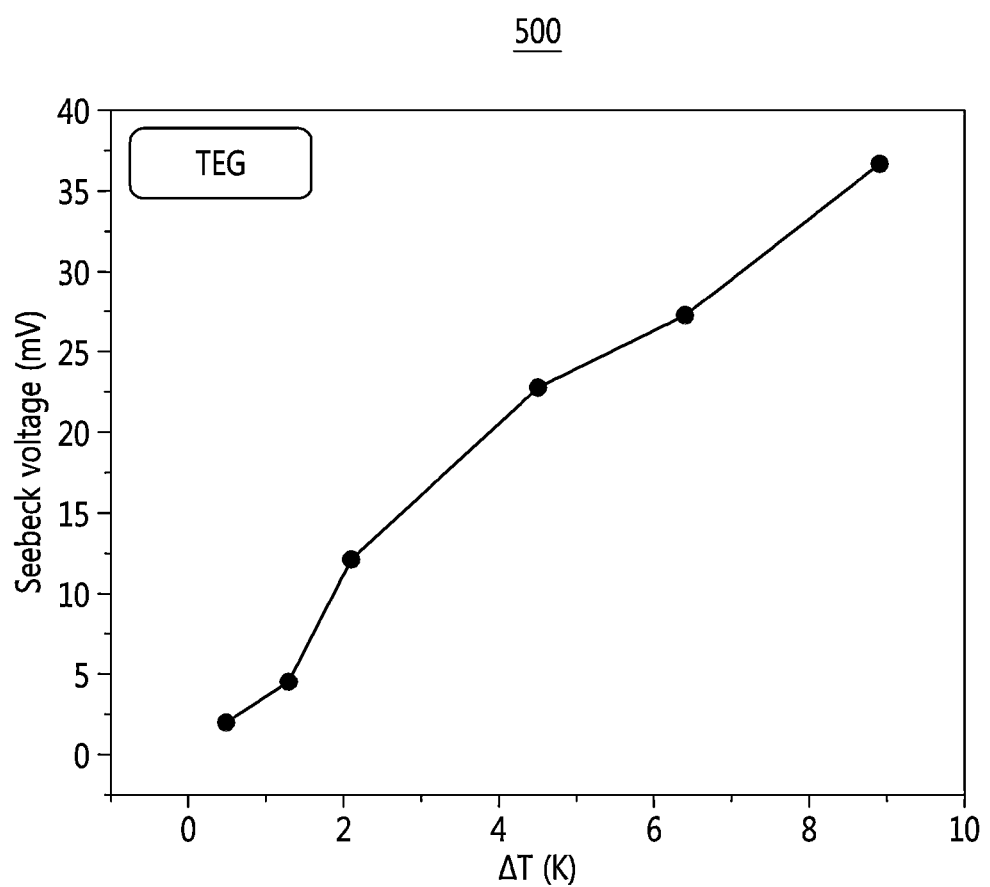
FIGS. 5A to 5D are graphs showing change in the electrical properties of a dual-sided all-in-one energy apparatus according to one embodiment of the present disclosure according to temperature difference and connection/disconnection.
Figure 5B:
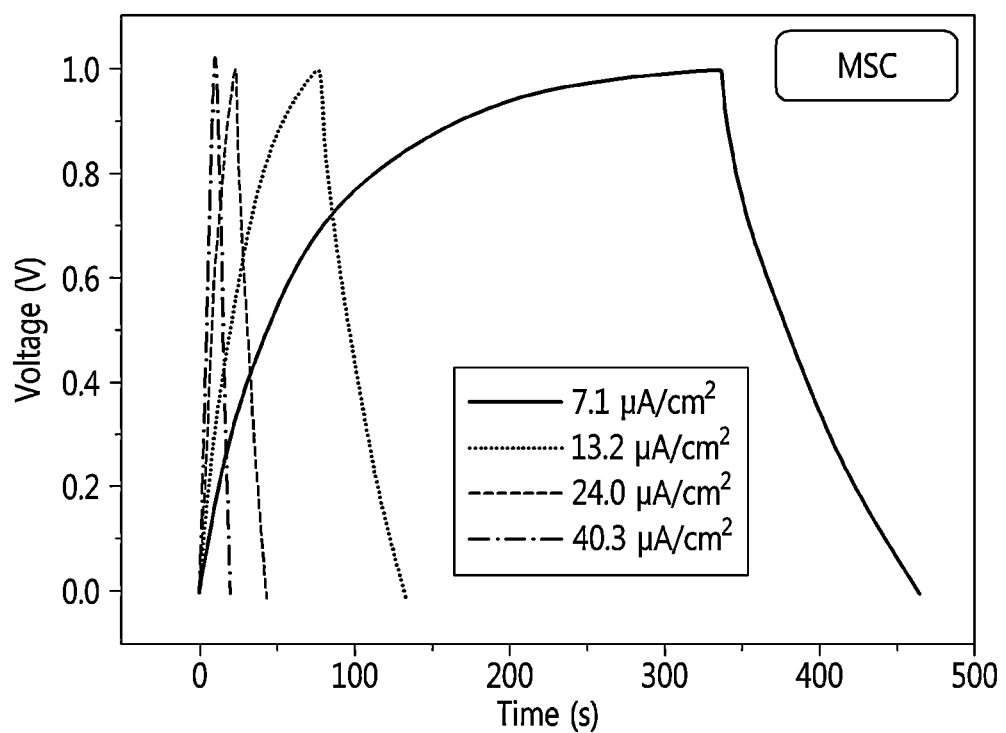

A graph 500 of FIG. 5A shows the Seebeck voltage of TEG as a function of $\Delta T$, and a graph 510 of FIG. 5B shows the galvanostatic charge/discharge (GCD) curves of the energy-storage device at different current densities.

Referring to the graph 500 of FIG. 5A, the Seebeck coefficient of the energy-harvesting device calculated based on the slope of the graph 500 may be 4.1 mV/K.

Referring to the graph 510 of FIG. 5B, in the case of the energy-storage device, GCD curves may be exhibited at a current density of 7.1 to 40.3 μA/cm$^2$.

The area capacitance of the energy-storage device may be calculated using the formula $C=(I/A) \cdot \Delta t/\Delta V$, where I may represent applied current, A may represent the total area of an active electrode, $\Delta t$ may represent a discharging time, and $\Delta V$ may represent a discharge voltage.

Accordingly, the maximum area capacitance of the energy-storage device may be 710.0 μF/cm$^2$ at a current density of 7.1 μA/cm$^2$.

Figure 5C:
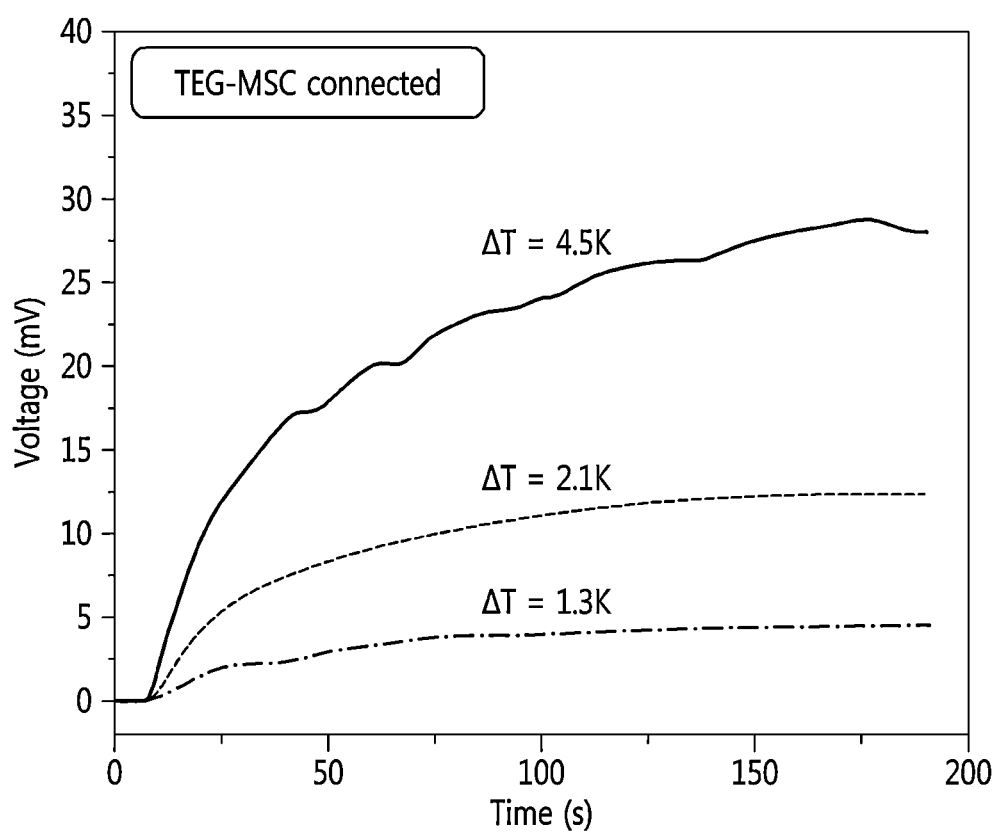
Figure 5D:
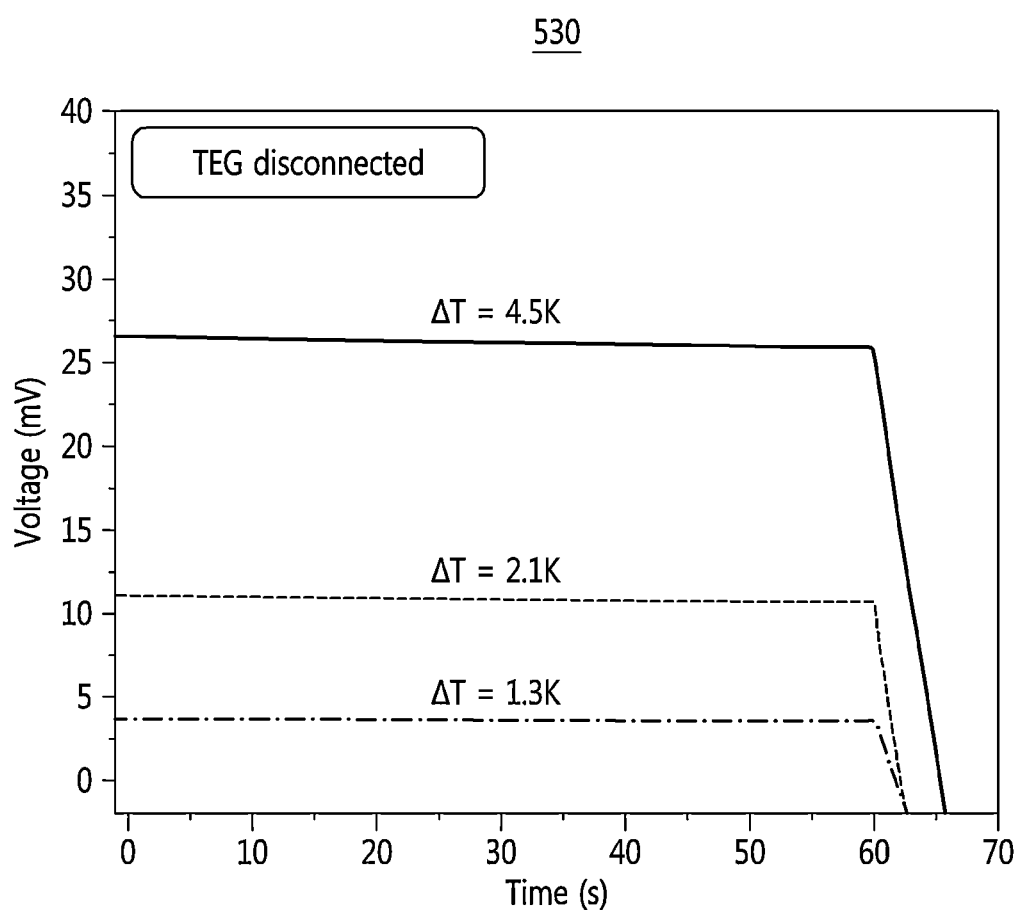

A graph 520 of FIG. 5C shows the voltage of the energy-storage device when the energy-storage device is connected to the energy-harvesting device with a different $\Delta T$, and a graph 530 of FIG. 5D shows the voltage of the energy-storage device separated from the energy-harvesting device.

The graph 520 of FIG. 5C shows the charging curve of the energy-storage device in the dual-sided all-in-one energy apparatus according to one embodiment of the present disclosure. As shown in the graph, it can be seen that the maximum voltage of the energy-storage device varies depending on a temperature difference ($\Delta T$) generated in the energy-harvesting device.

Even when a Seebeck voltage is immediately generated when a temperature difference ($\Delta T$) occurs, the time required for charging to the maximum Seebeck voltage may be increased when the temperature difference ($\Delta T$) is large.

When temperature difference ($\Delta T$) is 1.3 K, 2.1 K, or 4.5 K, the maximum voltage may be 4.6 mV, 12.2 mV, or 27.7 mV, respectively.

In the dual-sided all-in-one energy apparatus, the volumetric energy density and the power density of the energy-storage device may be 143.7 μJ/cm$^3$ and 718.6 mW/cm$^3$ when $\Delta T$ is 4.5 K, respectively, as shown in Table 2 below.

Table 2 shows the characteristics of a charged energy-storage device with a temperature difference ($\Delta T$) depending on the energy-harvesting device.

TABLE 2

|  | Charging voltage (mV) | Discharging time (s) | Area capacity (μF/cm$^2$) | Energy density (μJ/cm$^3$) | Power density (mW/cm$^3$) |
| --- | --- | --- | --- | --- | --- |
| $\Delta T$ = 1.3 K | 4.6 | 0.9 | 563.9 | 29.8 | 119.3 |
| $\Delta T$ = 2.1 K | 12.2 | 2.4 | 567.0 | 63.3 | 316.4 |
| $\Delta T$ = 4.5 K | 27.7 | 5.5 | 572.3 | 143.7 | 718.6 |

The energy-harvesting device and the energy-storage device may be separated when the energy-storage device is charged to the maximum Seebeck voltage.

The graph 530 of FIG. 5D shows a state after the charged energy-storage device is separated from the energy-harvesting device. As shown in the graph, it can be seen that the amount of charge stored in the energy-storage device is maintained constant until the energy-storage device is forcibly discharged.

As a result, the dual-sided all-in-one energy apparatus according to one embodiment of the present disclosure may generate electricity, and by connecting or disconnecting the energy-harvesting device and the energy-storage device, the generated electricity may be stored without loss.

Figure 6A:
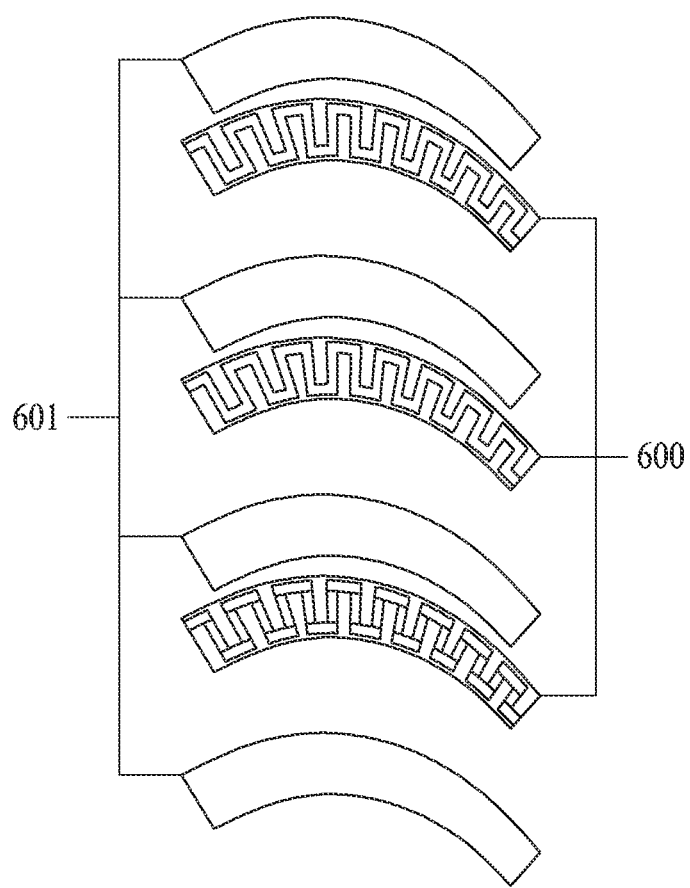
FIGS. 6A to 6C are an image and drawings showing an integrated dual-sided all-in-one energy system in which a plurality of dual-sided all-in-one energy apparatuses according to one embodiment of the present disclosure is vertically stacked.
Figure 6B:
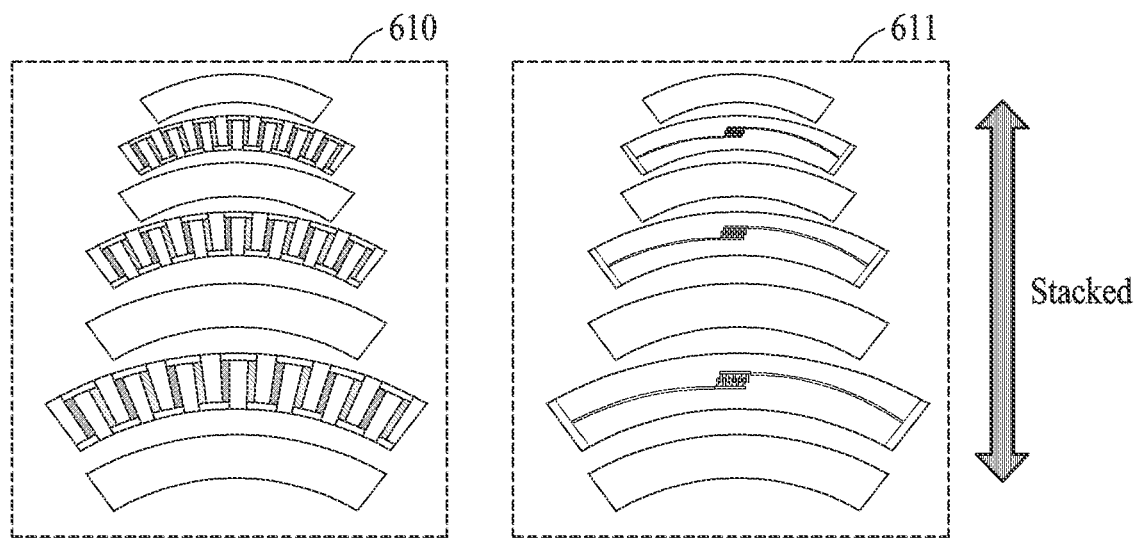
Figure 6C:
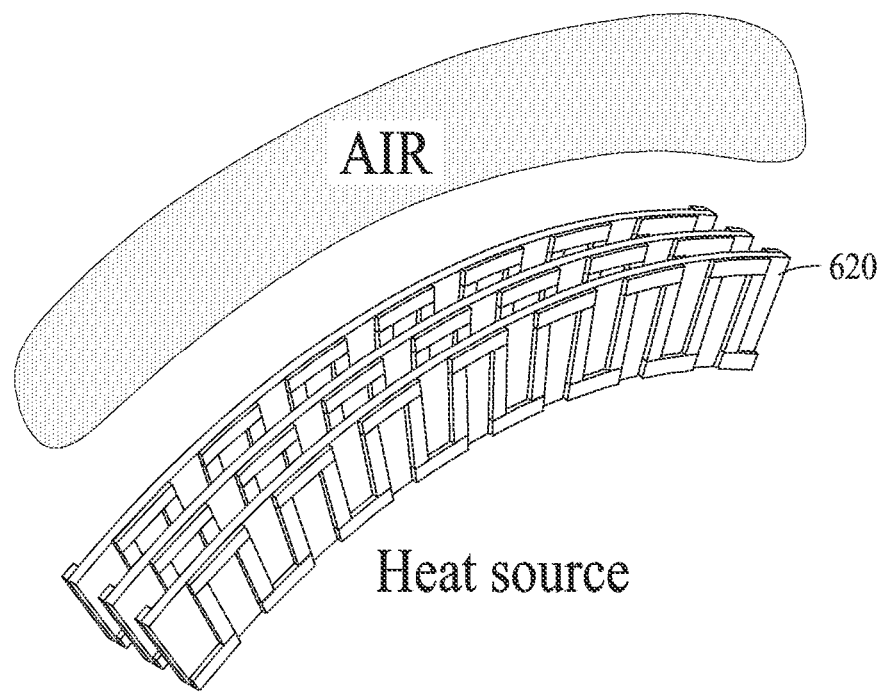

FIGS. 6A to 6C are an image and drawings showing an integrated dual-sided all-in-one energy system in which a plurality of dual-sided all-in-one energy apparatuses according to one embodiment of the present disclosure is vertically stacked.

FIG. 6A shows an example before a plurality of dual-sided all-in-one energy apparatuses 600 according to one embodiment of the present disclosure is adhered using PDMS 601 as an adhesive.

To investigate the consumability of the dual-sided all-in-one energy apparatus according to one embodiment of the present disclosure, three individual dual-sided all-in-one energy apparatuses may be stacked using polydimethylsiloxane (PDMS) as an adhesive to form an integrated dual-sided all-in-one energy system.

In the integrated dual-sided all-in-one energy system, the six wires of individual dual-sided all-in-one energy apparatuses may be connected in series to evaluate the characteristics of the dual-sided all-in-one energy system.

FIG. 6B shows an integrated dual-sided all-in-one energy system including a plurality of stacked dual-sided all-in-one energy apparatuses.

A power generation side 610 of the integrated dual-sided all-in-one energy system may represent a stacked structure of the energy-harvesting devices, and a storage side 611 may present a stacked structure of the energy-storage devices. Referring to FIG. 6C, the lower surface of an integrated dual-sided all-in-one energy system 620 may be in contact with a heat source, and the upper surface thereof may be exposed to the air to harvest energy based on a temperature difference between the upper surface and the lower surface and generate and store electrical energy. For example, the heat source may be human skin.

In addition, high-temperature electrodes may be arranged on the lower surface of the integrated dual-sided all-in-one energy system 620 to contact the heat source, and low-temperature electrodes may be arranged on the upper surface thereof to be exposed to the air.

Accordingly, according to the present disclosure, since a plurality of dual-sided all-in-one energy apparatuses is vertically stacked, electrical energy may be generated and stored without loss, thereby improving energy harvesting and storage performance.

In addition, the present disclosure may provide an integrated dual-sided all-in-one energy system that preserves electrical energy stored in an energy-storage device by separating an energy-harvesting device and the energy-storage device in a dual-sided all-in-one energy apparatus.

Figure 7A:
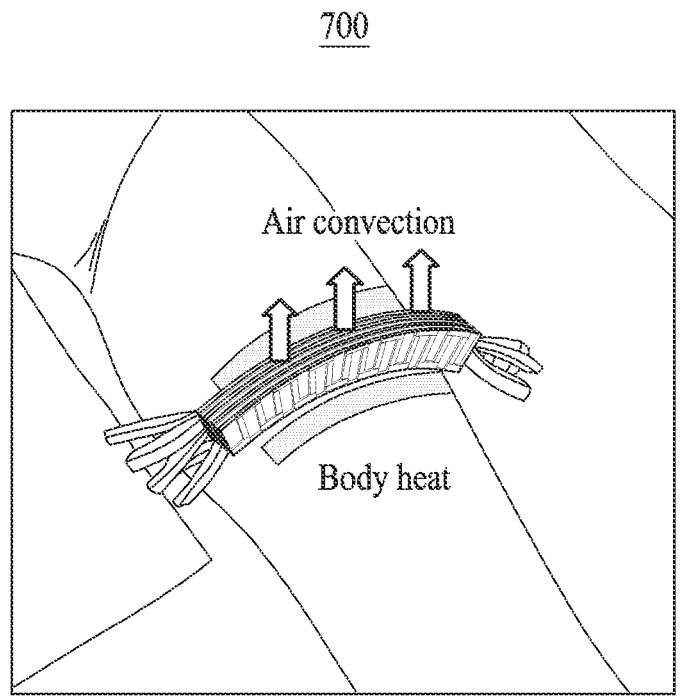
FIGS. 7A to 7C are images for explaining experimental results performed using an integrated dual-sided all-in-one energy system according to one embodiment of the present disclosure.
Figure 7B:
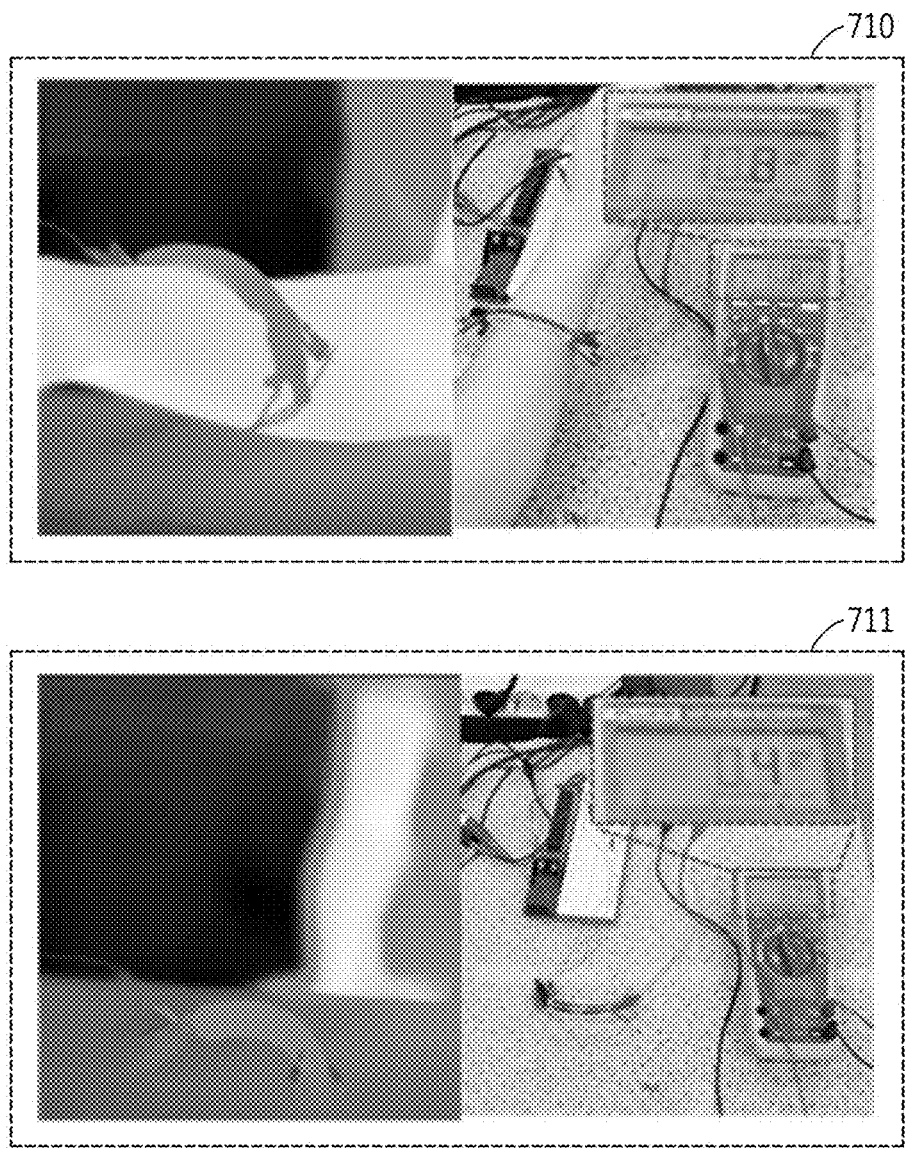
Figure 7C:
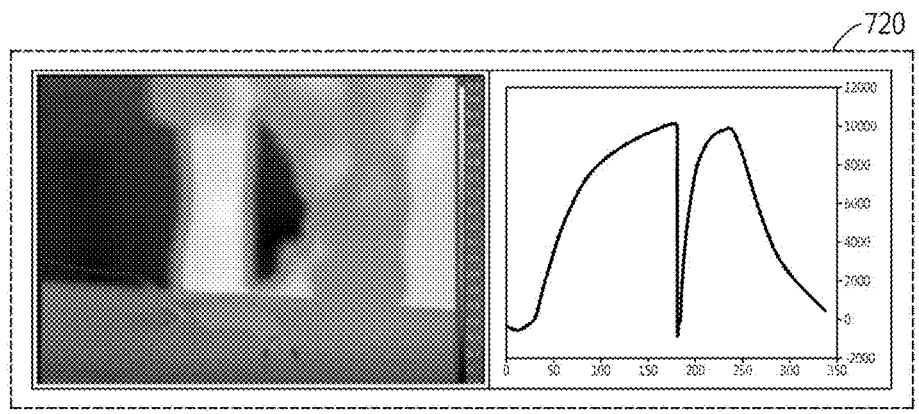
Figure 7C:
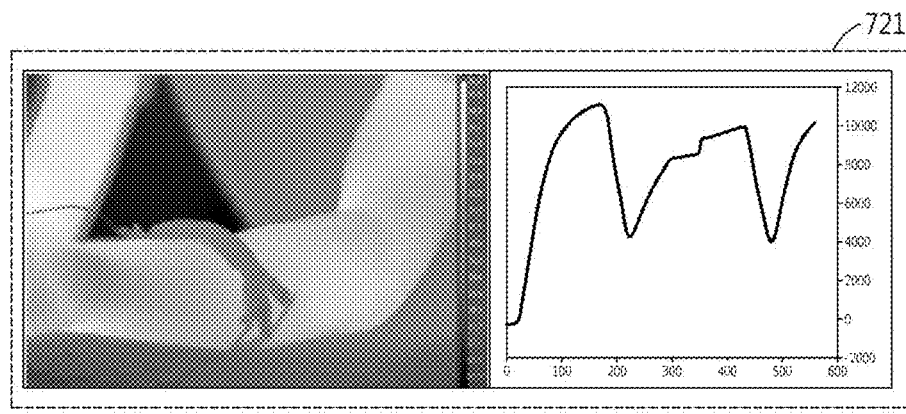

FIGS. 7A to 7C are images for explaining experimental results performed using an integrated dual-sided all-in-one energy system according to one embodiment of the present disclosure.

An image 700 of FIG. 7A shows an environment in which the integrated dual-sided all-in-one energy system according to one embodiment of the present disclosure is attached to an arm of the human body, the upper part thereof is exposed to air convection, and the lower part thereof is exposed to body heat to perform energy harvesting using temperature difference.

FIG. 7B compares a case in which the integrated dual-sided all-in-one energy system according to one embodiment of the present disclosure is attached to an arm of the human body and a case in which the integrated dual-sided all-in-one energy system is not attached to an arm of the human body.

An image 710 of FIG. 7B may represent a case in which the integrated dual-sided all-in-one energy system is attached to an arm of the human body, and an image 711 of FIG. 7B may represent a case in which the integrated dual-sided all-in-one energy system is not attached to an arm of the human body.

In the image 710, it can be seen that a voltage of 10.8 mV is generated in the energy-harvesting device using $\Delta T$ between the body temperature and the ambient temperature.

In image 711, it can be seen that voltage is 0.4 mV because $\Delta T$ is no longer obtained in the integrated dual-sided all-in-one energy system.

The image 711 may also show that electrical energy generated from the energy-harvesting device is not preserved in the energy-storage device when energy generated when the energy-harvesting device and the energy-storage device are connected does not flow into the energy-storage device.

As shown in FIG. 7C, when the integrated dual-sided all-in-one energy system is worn on the arm, the energy-harvesting device of the dual-sided all-in-one energy apparatus generates electrical energy from the body's thermal energy, and the energy-storage device stores the electrical energy.

Meanwhile, when the dual-sided all-in-one energy apparatus is removed from the arm while the energy-harvesting device and the energy-storage device are connected, the voltage of the energy-storage device may be reduced.

An image 720 of FIG. 7C shows a thermal profile video and an image capturing the voltage of the energy-storage device when the integrated dual-sided all-in-one energy system is worn on the forearm and removed.

An image 721 of FIG. 7C is an image captured when the action of wearing the integrated dual-sided all-in-one energy system on the arm and removing the system from the arm is performed 3 times.

Accordingly, the integrated dual-sided all-in-one energy system of the present disclosure may be attached to a part of the human body to harvest energy from the body's thermal energy to generate electrical energy, and may store the generated electrical energy in the energy-storage device. In addition, the integrated dual-sided all-in-one energy system of the present disclosure may store the electrical energy without losing energy until the energy-storage device is forcibly discharged.

Figure 8A:
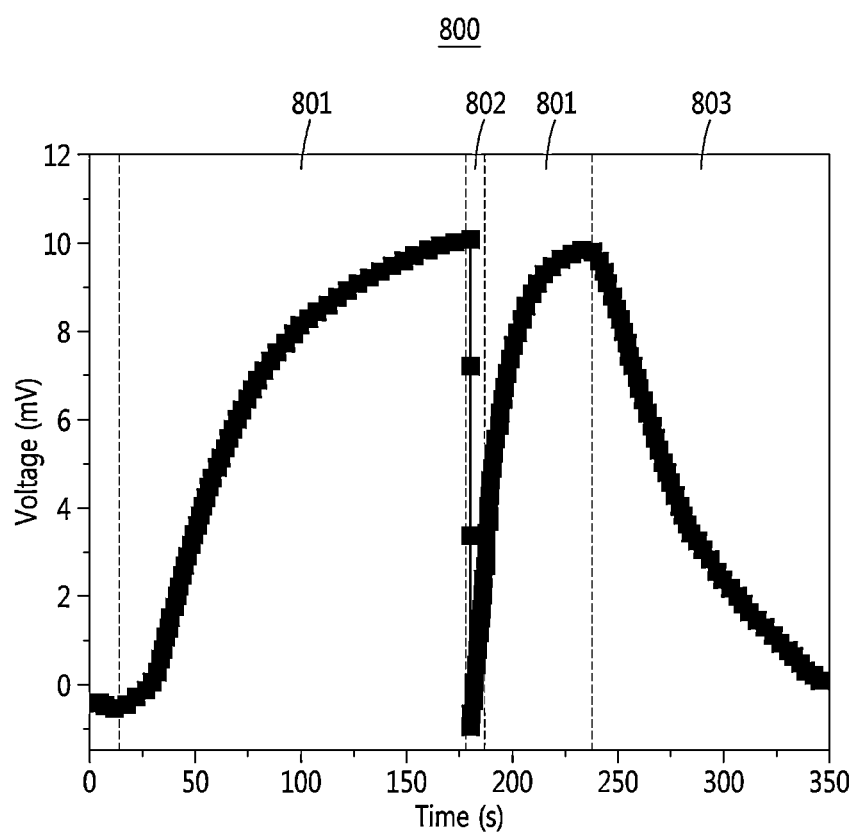
FIGS. 8A to 8C are graphs showing the voltage change of a dual-sided all-in-one energy apparatus according to one embodiment of the present disclosure according to connection and disconnection between an energy-harvesting device and an energy-storage device.
Figure 8B:
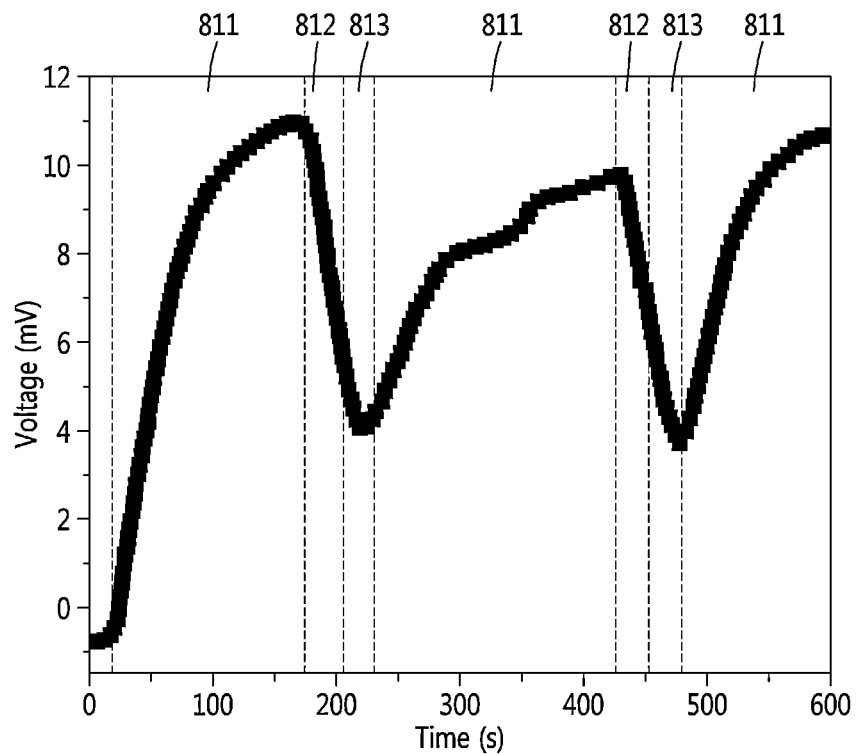
Figure 8C:
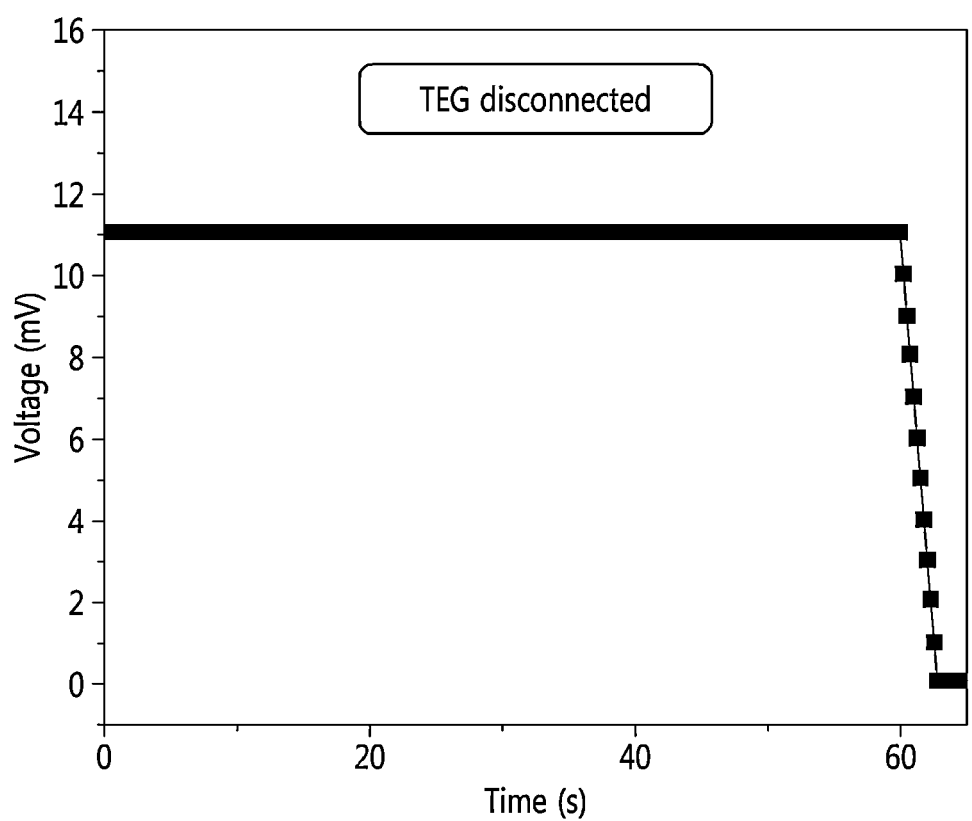

FIGS. 8A to 8C are graphs showing the voltage change of a dual-sided all-in-one energy apparatus according to one embodiment of the present disclosure according to connection and disconnection between an energy-harvesting device and an energy-storage device.

A graph 800 of FIG. 8A and a graph 810 of FIG. 8B may represent charging and discharging of the energy-storage device connected to the energy-harvesting device in four different situations.

Referring to the graph 800 of FIG. 8A, in a first time domain 801, the energy-storage device may be charged up to a maximum Seebeck voltage of 10.8 mV.

The graph 800 of FIG. 8A may be divided into the first time domain 801, a second time domain 802, and a third time domain 803.

The first time domain 801 may indicate a time required for the energy-storage device to be charged from the energy-harvesting device, the second time domain 802 may indicate a forced discharging time, and the third time domain 803 may indicate a time for the energy-storage device to be discharged after the integrated dual-sided all-in-one energy system is removed from the body.

In addition, after the energy-storage device is forcibly discharged within 1 second, since the energy-harvesting device generates a Seebeck voltage based on a temperature difference (ΔT) between the forearm temperature and the ambient temperature in the second time domain 802, the energy-harvesting device may be instantly recharged to 10.8 mV.

However, there is no possibility of reverse current flowing from the energy-storage device to the energy-harvesting device by separation of the energy-harvesting device and the energy-storage device.

The properties of the integrated dual-sided all-in-one energy system and the dual-sided all-in-one energy apparatus may be summarized in Table 3.

TABLE 3

| | Seebeck voltage (mV) | Charging potential (mV) | Charging efficiency (%) | Charging rate (V/min) | Charging energy density ($\mu J/cm^3$) | Charging power density ($mW/cm^3$) |
|---|---|---|---|---|---|---|
| Dual-sided all-in-one energy apparatus | 4.1 | 4.1 | 99 | 0.009 | 19.7 | 98.6 |
| Integrated dual-sided all-in-one energy system | 11.4 | 11.4 | 99 | 0.027 | 59.1 | 295.7 |

The third time region 803 may indicate that the energy-harvesting device no longer generates electrical energy and the energy-harvesting device is discharged.

Accordingly, in the third time region 803, reverse current may flow from the energy-storage device to the energy-harvesting device, and a Peltier effect may be induced in the energy-harvesting device.

As a result, the energy-storage device of the third time region 803 may not store electricity generated by energy-harvesting device unless the energy-storage device is separated from the energy-harvesting device.

The graph 810 of FIG. 8B shows the operation of the energy-storage device when the test of wearing and removing the integrated dual-sided all-in-one energy system on the forearm is repeated three times, and shows the rechargeable nature of the integrated dual-sided all-in-one energy system.

The graph 810 of FIG. 8B is divided into a first time domain 811, a third time domain 812, and a fourth time domain 813.

Here, the first time region 811 may indicate a time required for the energy-storage device to be charged from the energy-harvesting device, the third time domain 812 may indicate a time required for the integrated dual-sided all-in-one energy system to be discharged after being removed from the body, and the fourth time domain 813 may indicate a time for the integrated dual-sided all-in-one energy system to be discharged after the integrated dual-sided all-in-one energy system is worn again on the body.

When the energy-storage device is forcibly discharged, the graph 810 may similar to the graph 800 in terms of charging and discharging.

On the other hand, even when the integrated dual-sided all-in-one energy system is worn again on the forearm to recharge, the energy-storage device of the fourth time zone 813 may still be discharged.

This may indicate that reverse current flows until the potential of the energy-storage device is equal to the potential of the energy-harvesting device.

When the energy-harvesting device is disconnected from the energy-storage device being charged up to the maximum Seebeck voltage, as shown in a graph 820 of FIG. 8C, the energy-storage device may store energy without loss until the energy-storage device is forcibly discharged.

Referring to Table 3, the charging energy density and power density of the integrated dual-sided all-in-one energy system may be nearly three times greater than those of the dual-sided all-in-one energy apparatus.

Accordingly, the scalability of the dual-sided all-in-one energy apparatus may be confirmed by the similarity between the dual-sided all-in-one energy apparatus and the integrated dual-sided all-in-one energy system in the characteristics of electrical energy harvesting and storage.

Accordingly, according to the present disclosure, since a plurality of dual-sided all-in-one energy apparatuses is vertically stacked, a temperature difference between the high-temperature electrode and the low-temperature electrode of an energy-harvesting device may be increased, thereby providing an integrated dual-sided all-in-one energy system having improved thermoelectric efficiency and increased electrical energy generation efficiency and capacity.

Accordingly, according to the present disclosure, when an integrated dual-sided all-in-one energy system including a plurality of vertically stacked dual-sided all-in-one energy apparatuses is applied to a wearable apparatus, the wearable apparatus may power itself.

In addition, according to the present disclosure, a dual-sided all-in-one energy apparatus is formed in a flexible form, and thus may applied to various wearable apparatuses. In addition, the wearable apparatuses including the dual-sided all-in-one energy apparatus may power themselves.

The present disclosure can provide a dual-sided all-in-one energy apparatus including an energy-harvesting device and an energy-storage device disposed at both sides of a substrate.

According to the present disclosure, since a plurality of dual-sided all-in-one energy apparatuses is vertically stacked, a temperature difference between the high-temperature electrode and the low-temperature electrode of an energy-harvesting device can be increased, thereby providing an integrated dual-sided all-in-one energy system having improved thermoelectric efficiency and increased electrical energy generation efficiency and capacity.

According to the present disclosure, since an energy-harvesting device and an energy-storage device are separated with respect to a substrate, an dual-sided all-in-one energy apparatus capable of preventing reverse current from flowing from the energy-storage device to the energy-harvesting device can be provided.

According to the present disclosure, the energy-harvesting device and the energy-storage device are disposed at both sides, the contact resistance between the energy-harvesting device and the energy-storage device is reduced by mechanical pressing, thereby improving the thermoelectric performance of the energy-harvesting device.

According to the present disclosure, since a plurality of dual-sided all-in-one energy apparatuses is vertically stacked, electrical energy can be generated and stored without loss, thereby improving energy harvesting and storage performance.

The present disclosure can provide an integrated dual-sided all-in-one energy system that preserves electrical energy stored in an energy-storage device by separating an energy-harvesting device and the energy-storage device in a dual-sided all-in-one energy apparatus.

The integrated dual-sided all-in-one energy system of the present disclosure can be attached to a part of the human body to harvest energy from the body's thermal energy to generate electrical energy, and can store the generated electrical energy in an energy-storage device. In addition, the integrated dual-sided all-in-one energy system of the present disclosure can store the electrical energy without losing energy until the energy-storage device is forcibly discharged.

According to the present disclosure, when an integrated dual-sided all-in-one energy system including a plurality of vertically stacked dual-sided all-in-one energy apparatuses is applied to a wearable apparatus, the wearable apparatus can power itself.

According to the present disclosure, a dual-sided all-in-one energy apparatus is formed in a flexible form, and thus can applied to various wearable apparatuses. In addition, wearable apparatuses including the dual-sided all-in-one energy apparatus can power themselves.

In the above-described specific embodiments, elements included in the invention are expressed in singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

What is claimed is:

1. A dual-surface energy system comprising a plurality of dual-surface energy apparatuses, each of the plurality of dual-surface energy apparatuses comprises:
    an energy-harvesting device comprising a first electrode pattern disposed on a first surface of a substrate and generates electrical energy by harvesting energy based on a temperature difference between a first side and a second side of the first surface; and
    an energy-storage device comprising a second electrode pattern disposed on a second surface of the substrate opposite to the first surface and stores the electrical energy harvested by the energy-harvesting device,
    wherein the second electrode pattern comprises a capacitor electrode and a current collector connected to each other, and the current collector extends to a first end of the substrate and a second end of the substrate disposed opposite to the first end,
    wherein the current collector is disposed at an entire surface of at least one of the first end and the second end,
    wherein the first electrode pattern is disposed at an edge surface of the at least one of the first end and the second end,
    wherein the energy-harvesting device and the energy-storage device are electrically disconnected when a flat alligator clip is disposed at a center of the at least one of the first end and the second end,
    wherein the energy-harvesting device and the energy-storage device are electrically connected when the flat alligator clip is disposed at the edge of the at least one of the first end and the second end, and
    wherein the plurality of dual-surface energy apparatuses are vertically stacked and are interconnected in series.

2. The dual-surface energy system according to claim 1, wherein the energy-harvesting device is formed of an n-type thermoelectric material, a p-type thermoelectric material, and metal electrodes.

3. The dual-surface energy system according to claim 2, wherein the n-type thermoelectric material and the p-type thermoelectric material are formed into a plurality of modules comprising a thermoelectric channel,
    each of the plurality of modules comprises an n-type thermoelectric film and a p-type thermoelectric film, and
    metal electrodes are formed at both ends of the thermoelectric channel.

4. The dual-surface energy system according to claim 3, wherein the energy-harvesting device is controlled so that, as the n-type thermoelectric film and the p-type thermoelectric film are brought into close contact with the metal electrodes by mechanical pressing, resistance between the plurality of modules and the metal electrodes decreases, and conductivity increases.

5. The dual-surface energy system according to claim 3, wherein the n-type thermoelectric material comprises at least one of $Bi_2Se_{0.3}Te_{2.7}$, $Ag_2Se$, $HgSe$, $Ti_2C_3$, $Mo_2Ti_2C_3$, $PbTe$, $CoSb_3$, $SiGe$, and $ZnO$,
    the p-type thermoelectric material comprises at least one of $Bi_{0.3}Sb_{1.7}Te_3$, $Ag_2Te$, $HgTe$, $Mo_2C$, $CeFe_4Sb_{12}$, $Sb_2Te_3$, and $Cu_2O$, and
    the metal electrodes comprise at least one of aluminum (Al), gold (Au), titanium (Ti), copper (Cu), and tungsten (W).

6. The dual-surface energy system according to claim 1, wherein the capacitor electrode comprises at least one of reduced graphene oxide (rGO), carbon nanotubes (CNTs), graphene, $TiO_2$, $ZnO$, $MnO_2$, and $Ti_3C_2$ and the current collector comprises at least one of aluminum (Al), gold (Au), titanium (Ti), and copper (Cu).

7. The dual-surface energy system according to claim 1, wherein the capacitor electrode and the current collector are connected to each other to form a microelectrode.

8. The dual-surface energy system according to claim 1, wherein, when the energy-storage device discharges, the energy-harvesting device and the energy-storage device are electrically disconnected, thereby preventing reverse current from flowing backward from the energy-storage device to the energy-harvesting device.

* * * * *